United States Patent
Boles et al.

(10) Patent No.: US 11,978,808 B2
(45) Date of Patent: May 7, 2024

(54) VERTICAL ETCH HETEROLITHIC INTEGRATED CIRCUIT DEVICES

(71) Applicant: MACOM Technology Solutions Holdings, Inc., Lowell, MA (US)

(72) Inventors: Timothy Edward Boles, Tyngsboro, MA (US); James J. Brogle, Merrimac, MA (US); Margaret Mary Barter, Lowell, MA (US); David Hoag, Walpole, MA (US); Michael G. Abbott, Canton, MA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 5 days.

(21) Appl. No.: 17/661,642

(22) Filed: May 2, 2022

(65) Prior Publication Data

US 2022/0262959 A1 Aug. 18, 2022

Related U.S. Application Data

(62) Division of application No. 16/030,249, filed on Jul. 9, 2018, now Pat. No. 11,342,469.

(51) Int. Cl.
*H01L 29/868* (2006.01)
*H01L 21/02* (2006.01)
(Continued)

(52) U.S. Cl.
CPC ...... *H01L 29/868* (2013.01); *H01L 21/02129* (2013.01); *H01L 21/2652* (2013.01);
(Continued)

(58) Field of Classification Search
CPC ........................................... H01L 29/868
See application file for complete search history.

(56) References Cited

U.S. PATENT DOCUMENTS 3,677,280 A  7/1972  Weckler
3,982,267 A * 9/1976  Henry ................... H01L 29/868
                                                    257/617
(Continued)

FOREIGN PATENT DOCUMENTS

WO   WO-2018191539 A1 * 10/2018 ........... G01S 17/894

OTHER PUBLICATIONS

Non-Final Office Action for U.S. Appl. No. 16/030,249 dated Apr. 3, 2020.
(Continued)

*Primary Examiner* — Peter Bradford
(74) *Attorney, Agent, or Firm* — Perilla Knox & Hildebrandt LLP; Jason M. Perilla

(57) ABSTRACT

Vertical etch heterolithic integrated circuit devices are described. A method of manufacturing NIP diodes is described in one example. A P-type substrate is provided, and an intrinsic layer is formed on the P-type substrate. An oxide layer is formed on the intrinsic layer, and one or more openings are formed in the oxide layer. One or more N-type regions are implanted in the intrinsic layer through the openings in the oxide layer. The N-type regions form cathodes of the NIP diodes. A dielectric layer deposited over the oxide layer is selectively etched away with the oxide layer to expose certain ranges of the intrinsic layer to define a geometry of the NIP diodes. The intrinsic layer and the P-type substrate are vertically etched away within the ranges to expose sidewalls of the intrinsic layer and the P-type substrate. The P-type substrate forms the anodes of the NIP diodes.

20 Claims, 5 Drawing Sheets

(51) Int. Cl.
    *H01L 21/265*     (2006.01)
    *H01L 21/3065*    (2006.01)
    *H01L 21/768*     (2006.01)
    *H01L 21/822*     (2006.01)
    *H01L 23/29*      (2006.01)
    *H01L 23/535*     (2006.01)
    *H01L 23/66*      (2006.01)
    *H01L 27/06*      (2006.01)
    *H01L 29/04*      (2006.01)
    *H01L 29/16*      (2006.01)
    *H01L 29/66*      (2006.01)

(52) U.S. Cl.
    CPC .... *H01L 21/3065* (2013.01); *H01L 21/76805* (2013.01); *H01L 21/76895* (2013.01); *H01L 21/822* (2013.01); *H01L 23/291* (2013.01); *H01L 23/535* (2013.01); *H01L 23/66* (2013.01); *H01L 27/0676* (2013.01); *H01L 29/045* (2013.01); *H01L 29/16* (2013.01); *H01L 29/6609* (2013.01); *H01L 2223/6683* (2013.01)

(56) References Cited

U.S. PATENT DOCUMENTS

| | | | |
|---|---|---|---|
| 4,051,507 A | | 9/1977 | Rosvold |
| 4,131,488 A | | 12/1978 | Lesk et al. |
| 4,462,088 A | * | 7/1984 | Giuliani ............ G11C 11/5692 365/45 |
| 4,680,085 A | | 7/1987 | Vijan et al. |
| 4,692,998 A | | 9/1987 | Armstrong et al. |
| 4,737,236 A | | 4/1988 | Perko et al. |
| 5,223,442 A | * | 6/1993 | Kitagawa .......... H01L 29/66136 438/137 |
| 5,263,140 A | | 11/1993 | Riordan |
| 5,268,310 A | * | 12/1993 | Goodrich ............ H01L 21/56 438/533 |
| 5,272,370 A | * | 12/1993 | French ............ H01L 27/112 257/478 |
| 5,343,070 A | | 8/1994 | Goodrich et al. |
| 5,696,466 A | | 12/1997 | Li |
| 5,976,941 A | | 11/1999 | Boles et al. |
| 6,014,064 A | | 1/2000 | Boles et al. |
| 6,114,716 A | | 9/2000 | Boles et al. |
| 6,150,197 A | | 11/2000 | Boles et al. |
| 6,329,702 B1 | | 12/2001 | Gresham et al. |
| 6,555,440 B1 | | 4/2003 | Geefay |
| 7,026,223 B2 | | 4/2006 | Goodrich et al. |
| 7,402,842 B2 | | 7/2008 | Goodrich |
| 7,719,091 B2 | | 5/2010 | Brogle |
| 7,755,173 B2 | | 7/2010 | Mondi et al. |
| 7,868,428 B2 | | 1/2011 | Goodrich et al. |
| 2001/0055838 A1 | * | 12/2001 | Walker ............ H01L 27/1021 257/E27.071 |
| 2006/0199365 A1 | * | 9/2006 | Wilner ............ H01L 23/481 257/E21.597 |
| 2006/0220086 A1 | | 10/2006 | Charbuillet et al. |
| 2008/0197360 A1 | | 8/2008 | Sriram et al. |
| 2009/0302426 A1 | | 12/2009 | McLaughlin et al. |
| 2010/0096680 A1 | | 4/2010 | Mouli et al. |
| 2010/0176375 A1 | | 7/2010 | Lochtefeld |
| 2011/0133149 A1 | | 6/2011 | Sonehara |
| 2012/0212687 A1 | * | 8/2012 | Uchida ............ H01L 27/14643 257/435 |
| 2014/0154833 A1 | | 6/2014 | Wayama et al. |
| 2015/0255629 A1 | | 9/2015 | Gejo et al. |
| 2017/0077290 A1 | | 3/2017 | Kono et al. |
| 2017/0194456 A1 | * | 7/2017 | Bedell ............ H01L 21/0254 |
| 2018/0175241 A1 | | 6/2018 | Jain |
| 2018/0182844 A1 | * | 6/2018 | Nakamura .......... H01L 29/7397 |
| 2018/0233521 A1 | * | 8/2018 | Na ................ G01S 7/4914 |
| 2019/0311966 A1 | | 10/2019 | Konrath et al. |

OTHER PUBLICATIONS

Final Office Action for U.S. Appl. No. 16/030,249 dated Sep. 18, 2020.

Non-Final Office Action for U.S. Appl. No. 16/030,249 dated Jan. 6, 2021.

Final Office Action for U.S. Appl. No. 16/030,249 dated Jun. 21, 2021.

* cited by examiner

US 11,978,808 B2

VERTICAL ETCH HETEROLITHIC INTEGRATED CIRCUIT DEVICES

CROSS REFERENCE TO RELATED APPLICATIONS

This application is a divisional of U.S. Non-Provisional Application Ser. No. 16/030,249, filed Jul. 9, 2018, titled "VERTICAL ETCH HETEROLITHIC INTEGRATED CIRCUIT DEVICES," which is hereby incorporated herein by reference in its entirety.

BACKGROUND

The semiconductor industry continues to see demands for devices having lower cost, size, and power consumption, particularly for monolithic microwave integrated circuit (MMIC) devices. MMIC devices encompass integrated circuits (IC) designed for operation over microwave frequencies. MIMIC devices can be relied upon for mixing, power amplification, low-noise amplification, and high-frequency switching, among other operations.

BRIEF DESCRIPTION OF THE DRAWINGS

Aspects of the present disclosure can be better understood with reference to the following drawings. It is noted that the elements in the drawings are not necessarily to scale, with emphasis instead being placed upon clearly illustrating the principles of the embodiments. In the drawings, like reference numerals designate like or corresponding, but not necessarily the same, elements throughout the several views.

DETAILED DESCRIPTION

Figure 1:
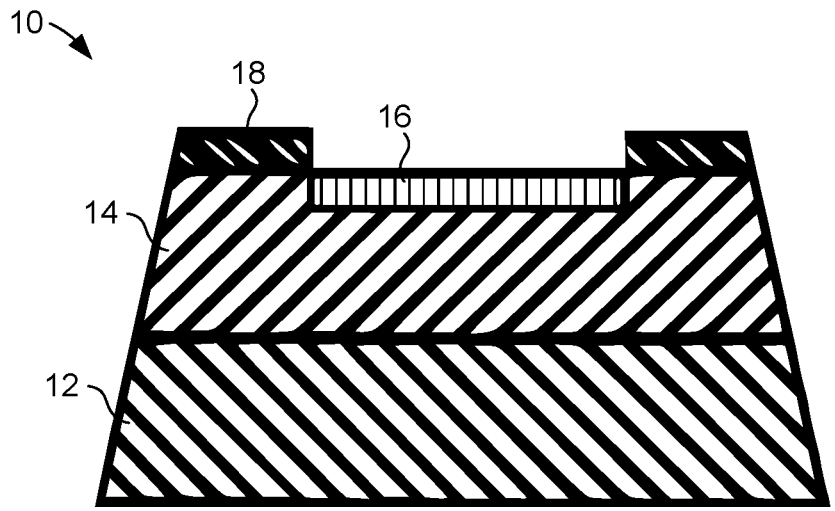
FIG. 1 illustrates an example mesa-type PIN diode according various embodiments described herein.

PIN diodes, including mesa-type PIN diodes, are used in integrated circuit devices that rely upon high frequency switching characteristics. An example mesa-type PIN diode is shown in FIG. 1 of U.S. Pat. No. 5,343,070, the entire disclosure of which is hereby incorporated herein by reference. In that example mesa-type PIN diode, a layer of intrinsic material is sandwiched between two layers of opposite conductivity. The top-most layer can be formed of P-type conductivity, while the bottom-most layer can be formed of N-type conductivity. The cross-sectional area of the layers in the mesa-type PIN diode decreases from the bottom-most layer to the top-most layer. Thus, the mesa-type PIN diode is formed resembling a top-truncated cone or a mesa-like shape.

FIG. 1 illustrates an example mesa-type PIN diode 10. The diode 10 is provided in FIG. 1 as a representative example for discussion. The shapes, sizes, and relative sizes of the various layers of the diode 10 are not necessarily drawn to scale. Additionally, the layers of the diode 10 shown in FIG. 1 are not exhaustive, and the diode 10 can include other layers and elements not separately illustrated. For example, the diode 10 can be encapsulated with a highly insulative material such as glass (not shown) to form a type of heterolithic microwave integrated circuit (HMIC).

The diode 10 includes an N-type semiconductor substrate 12, an intrinsic layer 14, and a P-type region 16 formed in the intrinsic layer 14 between an opening in an insulating layer 18. The N-type semiconductor substrate 12 can form a cathode of the diode 10, and the P-type region 16 can form the anode of the diode 10.

In one example, the N-type semiconductor substrate 12 can be formed by melting and mixing silicon with Arsenic, among other suitable dopants, to a concentration of about $2 \times 10^{19}$ Arsenic atoms/cm$^3$ and then solidifying the mixture, although the substrate 12 can be formed by other methods to other charge carrier concentrations. The intrinsic layer 14, which can be silicon in one example, can be formed over the substrate 12 using deposition or another suitable technique.

The insulating layer 18 can be formed as a layer of silicon dioxide, among other suitable insulators, on the upper surface of the intrinsic layer 14. The insulating layer 18 can have a thickness of between about 2000 Å and about 5000 Å and can be formed by oxidation in a furnace or reactor, local oxidation of the semi-conductor substrate, or other suitable process step. An opening can then be formed in the insulating layer 18 by etching a positive photoresist mask using wet chemistry and/or the application of plasma.

The P-type region 16 can formed at the top surface of the intrinsic layer 14 in the opening formed in the insulating layer 18. When the P-type region 16 is formed, a junction is created between the P-type region 16 and the intrinsic layer 14. The P-type region 16 can be formed by doping the intrinsic layer 14 with Boron to a concentration of about $2 \times 10^{19}$ atoms/cm$^3$, although other P-type dopants can be used to other charge carrier concentrations to form the junction. As described in U.S. Pat. No. 5,343,070, the area of the junction between the P-type region 16 and the intrinsic layer 14 can be selected by design to be smaller than the total surface area of the top surface of the intrinsic layer 14.

In some cases, the side-walls of one or both of the substrate 12 and the intrinsic layer 14 can be doped by an N-type dopant, such as phosphorus, to a concentration of between about $1 \times 10^{18}$ and about $1 \times 10^{21}$ phosphorus atoms/cm$^3$, although other N-type dopants can be used to other charge carrier concentrations. The N-doping of the substrate 12 and the intrinsic layer 14 can reduce Shockley-Read-Hall (SRH) charge-carrier recombination effects by reducing the overall device silicon surface area that is exposed to oxidation.

As described in U.S. Pat. No. 5,343,070, the diode 10 reduces Auger scattering effects as compared to other PIN diodes by increasing the volume of the intrinsic layer 14 relative to the junction surface area between the P-type region 16 and the intrinsic layer 14. Thus, the diode 10 is capable of achieving higher stored charge, lower resistance, lower capacitance, and lower power consumption as compared to other conventional types of PIN diodes.

Orientation-dependent etching (ODE) process steps have been used to form the diode 10, among other HMIC devices, from (1, 0, 0)-oriented N+ substrates (e.g., <0.0045 Ω-cm, 900 μm thick). The same ODE wet etching process is not as suitable for use with (1, 1, 1)-oriented P+ substrates. For example, ODE etched (1, 1, 1)-oriented P+ substrates have planes at a 54.7° angle to the front surface of the wafer. The result of using ODE wet etching process steps is pattern distortion after etching, where circular geometries became octagons and rectangles required certain features to maintain top pattern integrity.

Advanced silicon etching (ASE) is a deep reactive-ion etching (DRIE) technique to rapidly etch deep and high aspect ratio structures in semiconductors. Dry etch inductively coupled plasma (ICP) high resolution melting (HRM) equipment, for example, can be used to form deep cavities and structures in HMIC devices independent of pattern shape, crystal axis, and doping using a vertical etch chemistry. Dry vertical etch chemistry processes can be relied upon to use (1, 1, 1)-oriented P+ substrates, which was not feasible with wet etching processes, to fabricate new types of HMIC devices as described herein.

P+ substrates can be relied upon to form new types of SURMOUNT™ PIN and Schottky devices, NIP diodes and switches, limiters, voltage variable attenuators (VVAs), and other devices. The new types of devices can also be formed in grounded anode configuration, enabling improvements in power handling and simplified biasing circuits in many cases. Changing from an N+ to P+ substrate with the PIN diode 10 in FIG. 1, for example, would reverse the polarity of the PIN diode 10 to a NIP diode. This can simplify biasing for switches, because it may be easier to obtain the +30/−5V biasing for an all-shunt NIP switch from the standard biasing rails in power amplifiers than to obtain the +5/−30V biasing for an all-shunt PIN switch.

In the context outlined above, various aspects of vertical etch heterolithic integrated circuit devices and methods of forming the same are described herein. A NIP diode is described in one example. The NIP diode includes a P-type silicon substrate, an intrinsic layer of un-doped silicon formed on the P-type silicon substrate, and an oxide layer formed on the intrinsic layer. The oxide layer includes an opening, and an N-type region is implanted to a certain concentration and depth in the intrinsic layer under the opening in the oxide layer. The intrinsic layer and the P-type silicon substrate are vertically etched using dry etch ICP/HRM (e.g., "Bosch") process techniques. As compared to the PIN diode 10 shown in FIG. 1, NIP diodes formed according to the embodiments described herein have substantially vertical sidewalls rather than the mesa-like shape.

In some cases, the NIP diode can also include conductive regions on the vertical sidewalls of the intrinsic layer and the P-type silicon substrate. The NIP diode can also be encapsulated in an insulative material, such as borosilicate glass, formed around the vertical sidewalls of the intrinsic layer and the P-type silicon substrate. A number of backside processing steps can also be performed to directly ground the anode of the NIP diode. The NIP diode can also be integrated with various passive and active components in a monolithic circuit format suitable for microwave circuit applications.

A method of manufacturing NIP diodes is described in another example. A P-type substrate is provided, and an intrinsic layer is formed on the P-type substrate. An oxide layer is formed on the intrinsic layer, and one or more openings are formed in the oxide layer. One or more N-type regions are implanted in the intrinsic layer through the openings in the oxide layer. The N-type regions form cathodes of the NIP diodes. A dielectric layer deposited over the oxide layer is selectively etched away with the oxide layer to expose certain ranges of the intrinsic layer to define a geometry of the NIP diodes. The intrinsic layer and the P-type substrate are vertically etched away within the ranges to expose sidewalls of the intrinsic layer and the P-type substrate. The P-type substrate forms the anodes of the NIP diodes.

Conductive regions can be formed on the sidewalls of the intrinsic layer and the P-type substrate by diffusion of a P-type acceptor into the sidewalls. The NIP diodes can be encapsulated in an insulative material, such as borosilicate glass. A number of backside processing steps can also be performed to directly ground the anodes of the NIP diodes. The NIP diodes can also be integrated with various passive and active components in a monolithic circuit format suitable for microwave circuit applications.

Figure 2:
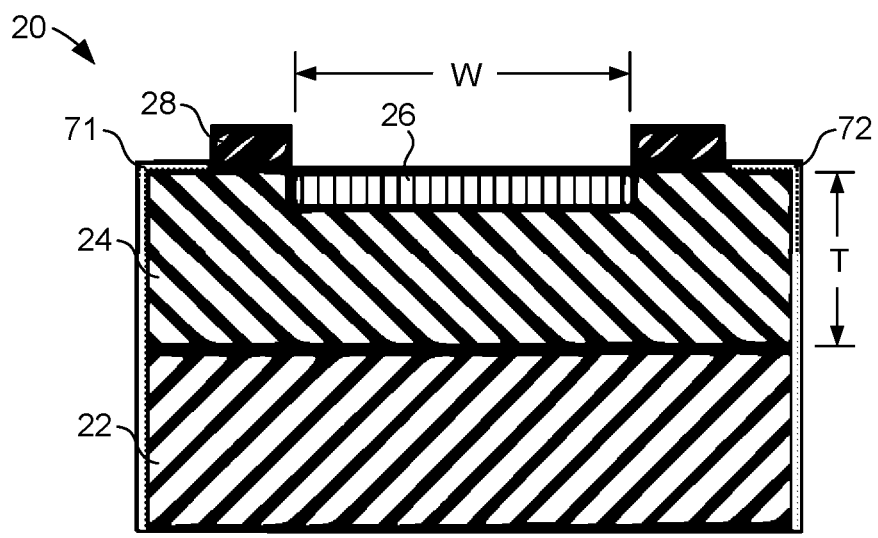
FIG. 2 illustrates an example NIP diode according various embodiments described herein.

Turning to particular examples, FIG. 2 illustrates a NIP diode 20 according various embodiments described herein. The diode 20 is provided in FIG. 2 as a representative example for discussion. The shapes, sizes, and relative sizes of the various layers of the diode 20 are not necessarily drawn to scale. Additionally, the layers of the diode 20 shown in FIG. 2 are not exhaustive, and the diode 20 can include other layers and elements not separately illustrated. For example, the diode 20 can be encapsulated with a highly insulative material such as glass (not shown) to form a type of HMIC device. Additionally, the diode 20 can be formed as part of a larger integrated circuit device in combination with other NIP diodes, capacitors, inductors, resistors, and layers of metal to electrically interconnect the circuit elements together to form switches, limiters, VVAs, and other devices.

As shown in FIG. 2, the diode 20 includes a P-type semiconductor substrate 22, a region of intrinsic layer 24 over the substrate 22, and an N-type region 26 formed in the intrinsic layer 24 between an opening in an insulating layer 28. The P-type semiconductor substrate 22 can form an anode of the diode 20, and the N-type region 26 can form the cathode of the diode 20. The side-walls of the substrate 22 and the intrinsic layer 24 can also include conductive regions 71 and 72. The conductive regions 71 and 72 can extend in some cases over at least a portion of a top surface of the intrinsic layer 24 as shown in FIG. 2.

As described in further detail below with reference to FIGS. 3A-3J, the P-type semiconductor substrate 22 can be embodied as a (1, 1, 1)-oriented P+ substrate (e.g., <0.005

Ω-cm, Boron-doped, 900 µm thick) in one example. The intrinsic layer 24, which can be un-doped silicon in one example, can be formed to a thickness T of about 5 µm to about 50 µm over the substrate 22 by epitaxial layer deposition. The intrinsic layer 24 can have a resistivity of greater than 100 Ω-cm in one example, and forms the intrinsic I-region of the diode 20.

The insulating layer 28 can be formed as a layer of oxide, such as silicon dioxide, among other suitable insulators, to a thickness of between about 2000 Å and about 5000 Å on the top surface of the intrinsic layer 24. The insulating layer 28 can be formed by wet thermal oxidation in a furnace or reactor, local oxidation of the intrinsic layer 24, or other suitable process step. An opening can then be formed in the insulating layer 28 by etching a positive photoresist mask using wet chemistry and/or the application of plasma. The opening can be formed to a width W within a range of about 5 µm to about 50 µm. The thickness T and the width W are two key parameters that control the performance of the diode 10.

The N-type region 26 can formed at the top surface of the intrinsic layer 24 in the opening formed in the insulating layer 28. When the N-type region 26 is formed, a junction is created between the N-type region 26 and the intrinsic layer 24. The N-type region 26 can be formed by doping the intrinsic layer 24 with Phosphorous to a concentration of about $2 \times 10^{19}$ atoms/cm$^3$, although other N-type dopants can be used to other charge carrier concentrations to form the junction.

The conductive regions 71 and 72 can be formed by P-type diffusion, such as diffusion of Boron, to a concentration of between about $10^{18}$ and about $10^{21}$ atoms/cm$^3$, although other P-type dopants can be used to other charge carrier concentrations.

Turning to other aspects of the embodiments, a method of forming the NIP diode 20 along with other devices in an integrated device is described with reference to FIGS. 3A-3J. Although the description is directed to the formation of diodes, the process steps can be relied upon to create other devices and other configurations of devices, along with capacitors, inductors, resistors, and layers of metal to electrically interconnect the circuit elements together.

Figure 3A:
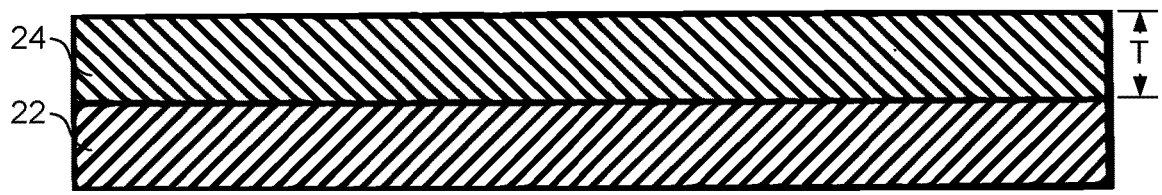
FIG. 3A illustrates a step of forming an intrinsic layer on a P-type silicon substrate in a method of forming the NIP diode shown in FIG. 2 according various embodiments described herein.

Referring first to FIG. 3A, the process includes providing a P-type semiconductor substrate 22. In one example, the substrate 22 can be embodied as a (1, 1, 1)-oriented P+ silicon substrate doped with Boron, having a resistivity of less than about <0.005 Ω-cm at a thickness of about 900 µm. The substrate 22 can be formed by melting and mixing silicon with Boron to a relatively high charge carrier concentration, although the substrate 12 can be formed by other methods. In other cases, the substrate 22 can be doped with other P++ acceptor dopants, to any suitable charge carrier concentration, and formed to any suitable thickness.

As also shown in FIG. 3A, the process includes forming the intrinsic layer 24 on the substrate 22. The intrinsic layer 24 can be formed by depositing a layer of un-doped, intrinsic silicon on a top surface of the substrate 22 using epitaxial deposition or another suitable technique. The intrinsic layer 24 can be formed to a thickness T of about 5 µm to about 50 µm over the substrate 22. Alternatively, the intrinsic layer 24 can be formed or provided for separately and bonded to the substrate 22 using any suitable bonding means. The intrinsic layer 24 can have a resistivity of greater than 100 Ω-cm in one example, and forms the intrinsic I-region of the diode 20.

Figure 3B:
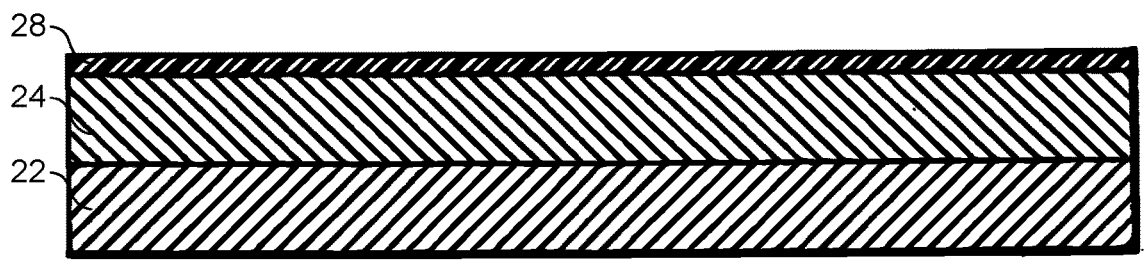
FIG. 3B illustrates a step of forming an oxide layer in the method of forming the NIP diode shown in FIG. 2 according various embodiments described herein.

Turning to FIG. 3B, the process includes growing an insulating layer 28 on the intrinsic layer 24. The insulating layer 28 can be formed as a layer of oxide, such as silicon dioxide, among other suitable insulators, to a thickness of between about 2000 Å and about 5000 Å on the top surface of the intrinsic layer 24. The insulating layer 28 can be formed by wet thermal oxidation in a furnace or reactor, local oxidation of the intrinsic layer 24, or other suitable process step.

Figure 3C:
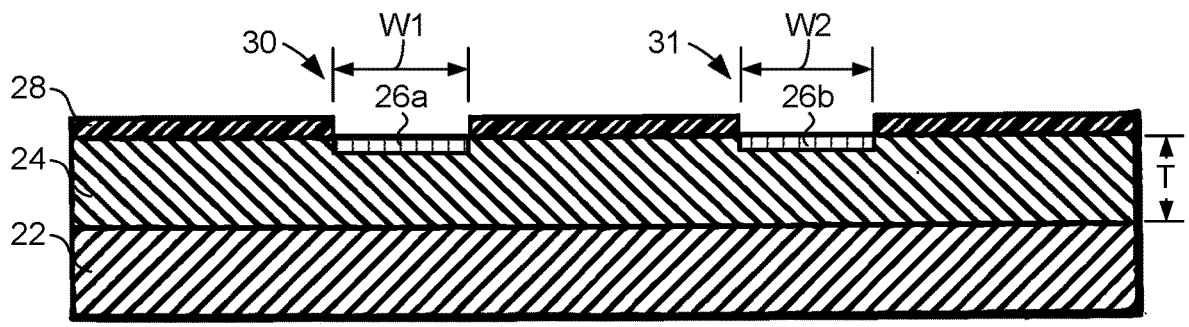
FIG. 3C illustrates a step of forming openings and implanting N-type regions in the oxide layer in the method of forming the NIP diode shown in FIG. 2 according various embodiments described herein.

Turning to FIG. 3C, the process includes forming openings 30 and 31 through the insulating layer 28. The openings 30 and 31, among others, can be formed by using a positive photomask to selectively etch the insulating layer 28 away in the areas of the openings 30 and 31, although the openings 30 and 31 can be formed in other suitable ways. The openings 30 and 31 can be formed, respectively, at widths of W1 and W2. As one example, the widths W1 and W2 can be formed within a range of about 5 µm to about 50 µm. Depending upon the desired characteristics of the devices being formed, the widths W1 and W2 can be the same as or different than each other. The thickness T of the intrinsic layer 24 and the widths W1 and W2 of the openings 30 and 31 are key parameters to control the performance of the devices being manufactured. As described below, the widths W1 and W2 of the openings 30 and 31 determine, at least in part, the lengths of the cathodes of the devices. The photomask can be removed through the use of wet chemistry and/or the application of plasma as necessary.

As also shown in FIG. 3A, the process includes creating N-type regions 26a and 26b in the intrinsic layer 24. The regions 26a and 26b can be created by implanting or diffusing Phosphorous ions into the intrinsic layer 24 where the openings 30 and 31 have been formed through the insulating layer 28. Thus, the regions 26a and 26b can be formed by a low energy, high dosage ion implantation or diffusion of Phosphorous into the intrinsic layer 24. For example, Phosphorous ions can be applied to the regions 26a and 26b at an energy of about 32 KeV and at a concentration of about $4 \times 10^{15}$ atoms/cm$^3$, to produce a junction having a charge carrier concentration of greater than about $10^{19}$ atoms/cm$^3$, although other energies and concentrations can be relied upon.

The regions 26a and 26b form the cathodes of the devices. When the regions 26a and 26b are formed, junctions are created between the intrinsic layer 24 and the regions 26a and 26b. The regions 26a and 26b can be formed by doping with Phosphorous to a concentration of about $2 \times 10^{19}$ atoms/cm$^3$, although other N-type dopants can be used to other charge carrier concentrations.

Figure 3D:
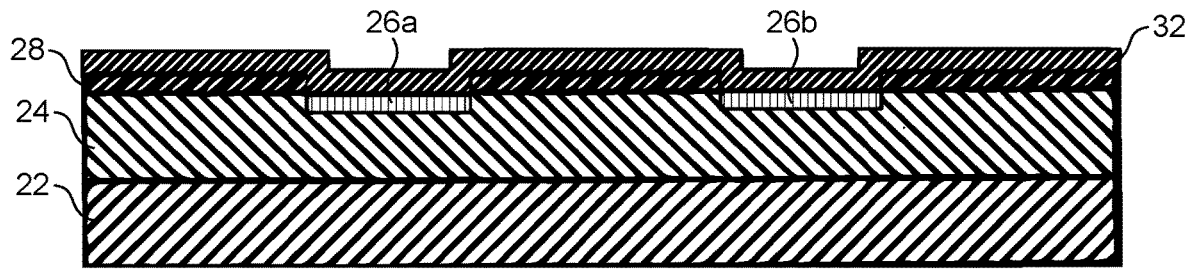
FIG. 3D illustrates a step of depositing a dielectric layer over the N-type regions in the method of forming the NIP diode shown in FIG. 2 according various embodiments described herein.

Turning to FIG. 3D, the process includes depositing a dielectric layer 32 over the insulating layer 28 and the regions 26a and 26b. The dielectric layer 32 forms a depressed region over the regions 26a and 26b. In one example, the dielectric layer 32 is formed by growing a thin thermal oxide before depositing a layer of about 1000 Å of Silicon Nitride ($Si_3N_4$) by low-pressure chemical-vapor-deposition (LPCVD). A layer of about 2000 Å of low temperature oxide (LTO) can also be deposited over the Silicon Nitride. These dielectrics of can form part of the geometry stack of the device and protect the cathode features of the regions 26a and 26b. Alternative materials and methods for forming the dielectric layer 32 can be relied upon.

Figure 3E:
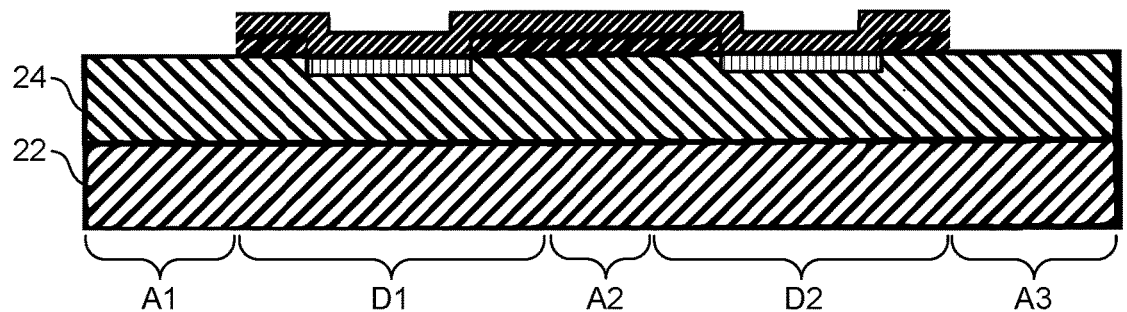
FIG. 3E illustrates a step of selectively etching the dielectric layer in the method of forming the NIP diode shown in FIG. 2 according various embodiments described herein.

Turning to FIG. 3E, the process includes selectively etching the dielectric layer 32 and the insulating layer 28 away in certain regions to expose the intrinsic layer 24 within the ranges A1, A2, and A3, to define a geometry of the diodes 20 and 40. The intrinsic layer 24 can be exposed over the ranges A1, A2, and A3, among others, by using a positive photomask, for example, to selectively etch the dielectric layer 32 and the insulating layer 28 away. The intrinsic layer 24 can also be exposed using other photolithography and/or etching process steps.

The selective etching can separate the dielectric layer 32 into dielectric layer regions 32a and 32b and separate the insulating layer 28 into insulating layer regions 28a and 28b as shown in FIG. 3E. After the selective etching, the dielectric layer regions 32a and 32b remain on the diodes 20 and 40, acting as a diffusion barrier in later process steps.

The diodes 20 and 40 will ultimately be formed to have widths D1 and D2, respectively. As one example, the width D1 of the diode 20 can be determined by the photomask mask width, preferably to at least the size of the width W1 of the region 26a plus one or two times the thickness T of the intrinsic layer 24 (see FIG. 3C). The width D2 of the diode 40 can be determined by the photomask mask width, preferably to at least the size of the width W2 of the region 26b plus one or two times the thickness T of the intrinsic layer 24 (see FIG. 3C).

Figure 3F:
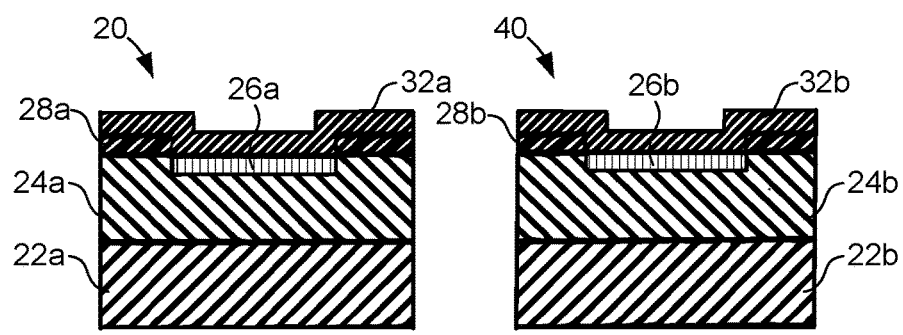
FIG. 3F illustrates a step of vertically etching the intrinsic layer and the P-type silicon substrate in the method of forming the NIP diode shown in FIG. 2 according various embodiments described herein.

Turning to FIG. 3F, the process includes vertically etching the intrinsic layer 24 and the substrate 22. The intrinsic layer 24 and the substrate 22 can be vertically etched over the ranges A1, A2, and A3 using ICP/HRM (e.g., "Bosch") process techniques as one example. The vertical etching separates the intrinsic layer 24 into the intrinsic layer 24a for the diode 20 and the intrinsic layer 24b for the diode 40 and separates the substrate 22 into the substrate 22a for the diode 20 and the substrate 22b for the diode 40. The width D1 of the diode 20 and the width D2 of the diode 40 can be maintained using a photoresist to protect the diodes 20 and 40, respectively. The vertically etching exposes the sidewalls of the intrinsic layers 24a and 24b and the substrates 22a and 22b of both the diodes 20 and 40.

Figure 3G:
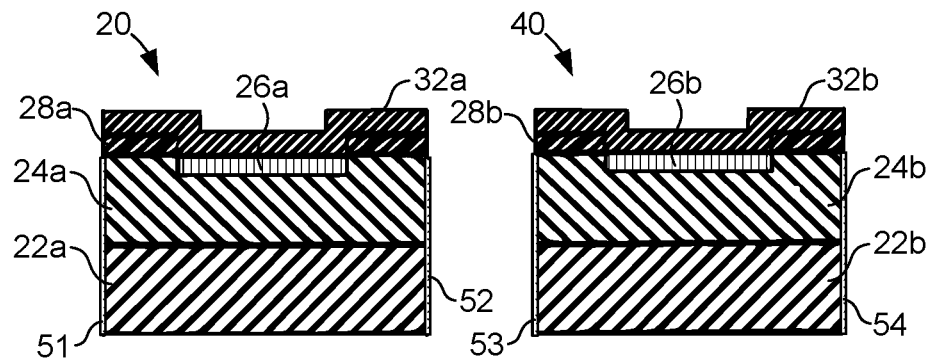
FIGS. 3G and 3H illustrate example steps of forming conductive regions on the sidewalls of the intrinsic layer and the P-type silicon substrate in the method of forming the NIP diode shown in FIG. 2 according various embodiments described herein.

Turning to FIG. 3G, in one embodiment, the process includes forming conductive regions 51 and 52 on the sidewalls of the intrinsic layer 24a and the substrate 22a of the diode 20 by diffusion or deposition of a P-type acceptor, such as Boron. The conductive regions 51 and 52 can be formed to prevent oxidation-related charge carrier recombination effects, among other purposes described below. The dopant concentration of the conductive regions 51 and 52 can be between about $10^{18}$ and about $10^{20}$ atoms per $cm^3$ and, preferably, to substantially the same concentration as the substrate 22a.

The process can also include forming conductive regions 53 and 54 on the sidewalls of the intrinsic layer 24b and the substrate 22b of the diode 40 by diffusion or deposition of a P-type acceptor, such as Boron. The conductive regions 53 and 54 can be formed to prevent oxidation-related charge carrier recombination effects, among other purposes described below. The dopant concentration of the conductive regions 53 and 54 can be between about $10^{18}$ and about $10^{21}$ atoms per $cm^3$ and, preferably, to substantially the same concentration as the substrate 22b. In some cases, the process can also include depositing a layer of Cobalt Silicide ($CoSi_2$) over the conductive regions 51-54.

Figure 3H:
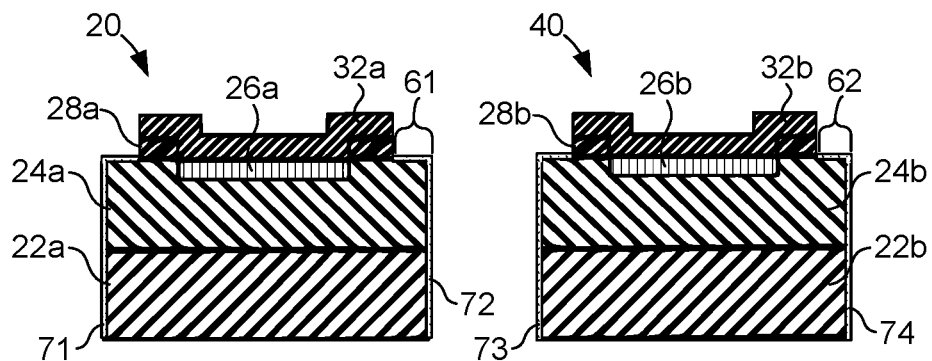

In an alternative embodiment shown in FIG. 3H, the dielectric layer region 32a and the insulating layer region 28a of the diode 20 can be removed from the region 61 of the top surface of the intrinsic layer 24a. As shown in FIG. 3H, the region 61 is on the right side of the diode 20, and a similar region of the intrinsic layer 24a can also be exposed on the left side of the diode 20. The dielectric layer region 32a and the insulating layer region 28a can be removed from the region 61, among others, using any suitable photolithography and/or etching process steps.

Similarly, the dielectric layer region 32b and the insulating layer region 28b of the diode 40 can be removed from the region 62 of the top surface of the intrinsic layer 24b. As shown in FIG. 3H, the region 62 is on the right side of the diode 40, and a similar region of the intrinsic layer 24b can also be exposed on the left side of the diode 40. The dielectric layer region 32b and the insulating layer region 28b can be removed from the region 62, among others, using any suitable photolithography and/or etching process steps.

Once the region 61, among others, is created, the process can include forming the conductive regions 71 and 72 on the sidewalls of the intrinsic layer 24a and the substrate 22a of the diode 20 by diffusion or deposition of Boron, for example, similar to the way described with reference to FIG. 3G. In this case, the conductive regions 71 and 72 can be formed to extend up and on the top of the intrinsic layer 24a over the region 61. The process can also include forming the conductive regions 73 and 74 on the sidewalls of the intrinsic layer 24b and the substrate 22b of the diode 40 by diffusion or deposition of Boron, for example, similar to the way described with reference to FIG. 3G. In this case, the conductive regions 73 and 74 are formed to extend up and on the top of the intrinsic layer 24b over the region 62.

The portions of the conductive regions 71-74 that extend over the regions 61 and 62, among others, are disposed in a planar orientation and can be relied upon as a continuous electrical connection from the substrates 22a and 22 to the top of the intrinsic layers 24a and 24b. The incorporation of the conductive regions 71-74 over the regions 61 and 62 allows for the diodes 20 and 40 to be used in a wide variety of MMIC applications. It also increases the number of biasing arrangements and configurations in which the diodes 20 and 40 may be used.

Figure 3I:
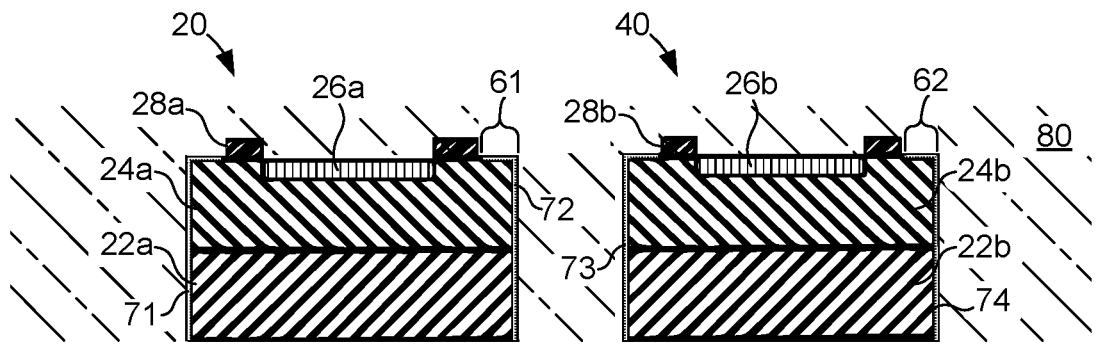
FIG. 3I illustrates a step of encapsulating in the method of forming the NIP diode shown in FIG. 2 according various embodiments described herein.

Before moving on, it is noted that other process steps can be relied upon although not specifically shown in the figures. For example, before turning to the step shown in FIG. 3I, the dielectric layer regions 32a and 32b can be removed in some cases, if desired, as shown in FIG. 3I. The dielectric layer regions 32a and 32b can be removed using wet chemical process steps, for example, by application of phosphoric acid having a concentration of about 87% at about 180° C., or using other conventional techniques.

Alternatively, before turning to FIG. 3I, another dielectric layer can be formed over the dielectric layer regions 32a and 32b by growing a layer of Silicon Nitride using LPCVD. A layer of LTO can also be deposited over the Silicon Nitride. These dielectrics of can protect the cathode features of the regions 26a and 26b, if needed. Thus, although FIG. 3I is illustrated without the dielectric layer regions 32a and 32b, the diodes 20 and 40 can include one or more dielectric layer regions over the regions 26a and 26b in practice.

Turning to FIG. 3I, the process includes encapsulating the diodes 20 and 40 in an insulative material 80. The insulative material 80 can preferably be borosilicate glass, although other materials can be used. The insulative material 80 can exhibit a thermal coefficient of expansion similar to silicon, providing ruggedness over a range of temperatures. The encapsulating can be achieved by placing a quantity of the insulative material 80 in contact with the diodes 20 and 40. The insulative material 80 can have a wafer-like shape, at a thickness of about 300 microns, for example, and can span the diodes 20 and 40, among other features and elements to be encapsulated.

Next, the diodes 20 and 40 and the insulative material 80 can be subjected to conditions (e.g., temperature and pressure) sufficient to cause the viscosity of the insulative material 80 to decrease to the point that it flows into cavities between the diodes 20 and 40. As one example, the conditions can include an ambient temperature and pressure between 750° C. and 800° C. and between 0 and 5 mTorr for about 30 minutes. The pressure can then be increased at a constant rate until a final pressure is reached to mitigate the formation of void pockets between the diodes 20 and 40. The encapsulating process can take place in a vacuum furnace or other suitable reactor vessel in which environmental conditions (e.g., atmosphere, atmospheric pressure, and temperature) are carefully controlled.

The insulative material 80 is permitted to harden. Afterwards, the top surface of the insulative material 80 can be be ground, polished, or otherwise finished to provide a smooth low-loss microstrip medium. This permits the use of photolithography and other conventional integration techniques to incorporate passive circuit elements, such as capacitors, inductors, and resistors, and active circuit elements with the diodes 20 and 40 in a monolithic fashion. The passive and/or active circuit elements can thus be formed on the top surface of the insulative material 80, for example, before or after metallization steps to electrically couple the circuit elements with the diodes 20 and/or 40 in the desired configuration.

Figure 3J:
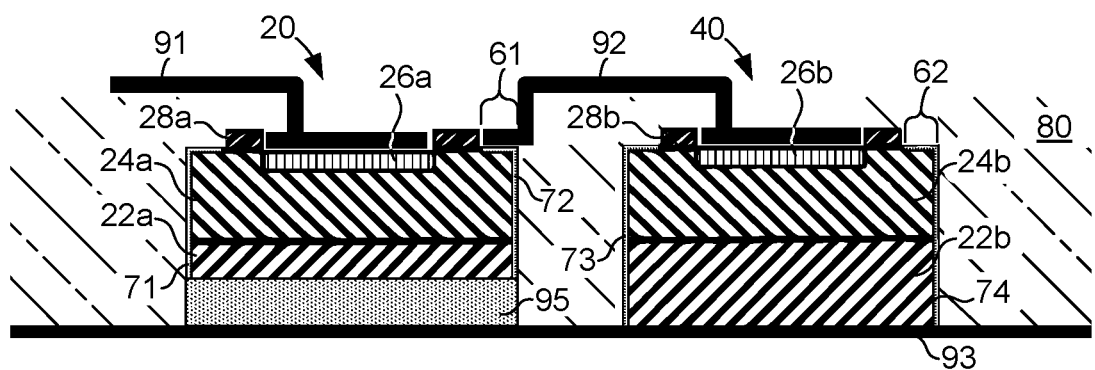
FIG. 3J illustrates a step of forming electrical contacts with the N-type regions in the method of forming the NIP diode shown in FIG. 2 according various embodiments described herein.

Turning to FIG. 3J, a number of additional process steps for providing electrical contacts to and interconnecting the diodes 20 and 40 are described. The process includes etching contact openings through the insulative material 80 to form electrical contacts with the regions 26a and 26b. According to the example shown in FIG. 3J, the diodes 20 and 40 are interconnected, with the diode 20 connected as a series diode and the diode 40 connected as a shunt diode. The metal interconnect 91, which is representatively illustrated in FIG. 3J, is relied upon to provide an electrical contact with the cathode of the diode 20 at the region 26a. The metal interconnect 91 can be formed through any conventional process, such as deposition, for example. The metal interconnect 92 is relied upon to provide an electrical contact between the anode of the diode 20 (via the conductive region 72 that extends from the substrate 22a to the region 61) and the cathode of the diode 40 at the region 26b.

In some cases, electrical contacts and interconnections can also be facilitated by backside processing of the substrate 22 and/or the substrates 22a and 22b. For example, the metal interconnect 92 can be formed to contact the substrate 22b of the diode 40, which acts as the anode of the diode 40. To use the diode 20 as a series diode in the configuration shown in FIG. 3K, the process also includes isolating the substrate 22a of the diode 20, which acts as the anode of the diode 20, before the metal interconnect 92 is formed. The substrate 22a can be etched away to leaving a void in the substrate 22a at a thickness of about 50 µm, for example. The void can be filled by a dielectric layer 95, such as Boron Nitride, which isolates the remainder of the substrate 22a from the metal interconnect 92.

The method described herein can be used to fabricate a wide variety of useful integrated circuits. For example, the diodes 20 and 40 described above can be integrated with various components in a monolithic circuit format suitable for microwave circuit applications. Although embodiments have been described herein in detail, the descriptions are by way of example.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

Therefore, the following is claimed:

1. A method of manufacturing a device, comprising:
   providing a P-type silicon substrate having a crystal orientation and being formed from melted silicon mixed with a P-type dopant;
   forming an intrinsic layer on the P-type silicon substrate;
   growing an oxide layer on the intrinsic layer;
   forming at least one opening in the oxide layer;
   implanting an N-type region in the intrinsic layer through the at least one opening in the oxide layer;
   depositing a dielectric layer over the oxide layer and the N-type region;
   selectively etching regions of the dielectric layer and the oxide layer away to expose at least one area of the intrinsic layer and define a geometry of the device; and
   vertically etching the intrinsic layer and the P-type silicon substrate away within the at least one area to expose sidewalls of the intrinsic layer and the P-type silicon substrate.

2. The method according to claim 1, further comprising forming conductive regions on the sidewalls of the intrinsic layer and the P-type silicon substrate by diffusion of a P-type acceptor into the sidewalls.

3. The method according to claim 1, further comprising encapsulating the device in an insulative material.

4. The method according to claim 3, further comprising etching contact openings through the insulative material to form an electrical contact with the N-type region.

5. The method according to claim 4, further comprising performing at least one backside processing step to form a direct electrical contact with the P-type silicon substrate.

6. The method according to claim 5, wherein:
   the direct electrical contact with the P-type silicon substrate comprises an electrical contact with an anode of the device; and
   the electrical contact with the N-type region comprises an electrical contact with a cathode of the device.

7. The method according to claim 1, wherein the vertically etching comprises deep reactive-ion etching the intrinsic layer and the P-type silicon substrate.

8. The method according to claim 1, wherein the vertically etching comprises etching the intrinsic layer and the P-type silicon substrate such that the sidewalls extend at an angle of greater than 54.7° to a top surface of the oxide layer.

9. The method according to claim 1, wherein the vertically etching comprises etching the intrinsic layer and the P-type silicon substrate such that the sidewalls extend at an angle of greater than 54.7° and less than 90° to a top surface of the oxide layer.

10. The method according to claim 1, wherein the P-type silicon substrate comprises a (1, 1, 1)-oriented P+ substrate.

11. A method of manufacturing a device, comprising:
    providing a P-type silicon substrate having a crystal orientation and being formed from melted silicon mixed with a P-type dopant;
    forming an intrinsic layer on the P-type silicon substrate;
    growing an oxide layer on the intrinsic layer;
    forming at least one opening in the oxide layer;
    implanting an N-type region in the intrinsic layer through the at least one opening in the oxide layer; and
    vertically etching the intrinsic layer and the P-type silicon substrate away to expose sidewalls of the intrinsic layer and the P-type silicon substrate.

12. The method according to claim 11, further comprising:

before the vertically etching, depositing a dielectric layer over the N-type region; and selectively etching regions of the dielectric layer away to expose at least one area of the intrinsic layer and define a geometry of the device, wherein:

the vertically etching comprises vertically etching the intrinsic layer and the P-type silicon substrate away within the at least one area.

13. The method according to claim 12, wherein:

growing the oxide layer comprises growing the oxide layer on the intrinsic layer after forming the intrinsic layer;

forming the at least one opening in the oxide layer comprises forming at least two openings in the oxide layer; and implanting the N-type region comprises implanting the N-type region in the intrinsic layer through the at least two openings in the oxide layer.

14. The method according to claim 11, further comprising forming conductive regions on the sidewalls of the intrinsic layer and the P-type silicon substrate by diffusion of a P-type acceptor into the sidewalls.

15. The method according to claim 11, further comprising encapsulating the device in an insulative material.

16. The method according to claim 15, further comprising:

etching contact openings through the insulative material to form an electrical contact with the N-type region; and performing at least one backside processing step to form a direct electrical contact with the P-type silicon substrate.

17. The method according to claim 16, wherein:

the direct electrical contact with the P-type silicon substrate comprises an electrical contact with an anode of the device; and the electrical contact with the N-type region comprises an electrical contact with a cathode of the device.

18. The method according to claim 11, wherein the vertically etching comprises deep reactive-ion etching the intrinsic layer and the P-type silicon substrate.

19. The method according to claim 11, wherein the vertically etching comprises etching the intrinsic layer and the P-type silicon substrate such that the sidewalls extend at an angle of greater than 54.7° to a top surface of the oxide layer.

20. The method according to claim 11, wherein the vertically etching comprises etching the intrinsic layer and the P-type silicon substrate such that the sidewalls extend at an angle of greater than 54.7° and less than 90° to a top surface of the oxide layer.

* * * * *